United States Patent
Aharonov

(10) Patent No.: US 10,900,439 B2
(45) Date of Patent: Jan. 26, 2021

(54) CYLINDER LINERS WITH ADHESIVE METALLIC LAYERS AND METHODS OF FORMING THE CYLINDER LINERS

(71) Applicant: FEDERAL-MOGUL LLC, Southfield, MI (US)

(72) Inventor: Robert Aharonov, West Bloomfield, MI (US)

(73) Assignee: Tenneco Inc., Lake Forest, IL (US)

( * ) Notice: Subject to any disclaimer, the term of this patent is extended or adjusted under 35 U.S.C. 154(b) by 611 days.

(21) Appl. No.: 15/706,998

(22) Filed: Sep. 18, 2017

(65) Prior Publication Data

US 2018/0003125 A1 Jan. 4, 2018

Related U.S. Application Data

(62) Division of application No. 13/801,736, filed on Mar. 13, 2013, now Pat. No. 9,765,726.

(51) Int. Cl.
*F02F 1/00* (2006.01)
*C23C 14/04* (2006.01)
(Continued)

(52) U.S. Cl.
CPC ............ *F02F 1/004* (2013.01); *C23C 14/025* (2013.01); *C23C 14/046* (2013.01);
(Continued)

(58) Field of Classification Search
CPC ..... C23C 28/42; C23C 28/347; C23C 28/343; C23C 28/34; C23C 28/322;
(Continued)

(56) References Cited

U.S. PATENT DOCUMENTS 3,606,359 A * 9/1971 McCormick .............. C23C 4/06
428/564
5,301,211 A 4/1994 Bryan et al.
(Continued)

FOREIGN PATENT DOCUMENTS

DE 2820301 A1 11/1979
GB 2030180 A 4/1980
(Continued)

OTHER PUBLICATIONS

Hagedorn D. et al., "Magnetron sputter process for inner cylinder coatings," Surface and Coatings Technology, Elsevier, Amsterdam, NL, vol. 203, Issues 5-7, Dec. 25, 2008, pp. 632-637 (see abstract; Figure 1).

(Continued)

*Primary Examiner* — Hung Q Nguyen
*Assistant Examiner* — Susan E Scharpf
(74) *Attorney, Agent, or Firm* — Robert L. Stearns; Dickinson Wright, PLLC

(57) ABSTRACT

A coated cylinder liner 20 comprises a wear resistant layer 22, such as a DLC coating, and a metallic adhesive layer 24, such as chromium or titanium, deposited on an inner surface 26 thereof. The layers 22, 24 each have a thickness $t_w$, $t_a$ varying by not more than 5% along at least 70% of the length of the inner surface 26. The metallic adhesive layer 24 is deposited by sputtering a consumable metallic electrode 28 onto the inner surface 26. The sputtering can be magnetron sputtering. The consumable metallic electrode 28 can include a hollow opening 40 with orifices 50 for providing a carrier gas into the deposition chamber 52. In addition, the inner surface 26 of the cylinder liner 20 can provide the deposition chamber 52 by sealing a first opening 36 and second opening 38 of the cylinder liner 20.

6 Claims, 5 Drawing Sheets

(51) Int. Cl.
*C23C 14/35* (2006.01)
*H01J 37/34* (2006.01)
*C23C 14/02* (2006.01)
*C23C 14/06* (2006.01)
*C23C 28/00* (2006.01)

(52) U.S. Cl.
CPC .......... *C23C 14/0605* (2013.01); *C23C 14/35* (2013.01); *C23C 28/322* (2013.01); *C23C 28/34* (2013.01); *C23C 28/343* (2013.01); *C23C 28/347* (2013.01); *C23C 28/42* (2013.01); *H01J 37/34* (2013.01); *H01J 37/3411* (2013.01)

(58) Field of Classification Search
CPC ... C23C 14/0605; C23C 14/025; C23C 14/35; C23C 14/046; F02F 1/004; H01J 37/34; H01J 37/3411
See application file for complete search history.

(56) References Cited

U.S. PATENT DOCUMENTS

| | | | |
|---|---|---|---|
| 5,879,763 A | 3/1999 | Sugiyama et al. | |
| 6,033,533 A | 3/2000 | Sugiyama | |
| 6,126,793 A | 10/2000 | Sugiyama et al. | |
| 6,162,500 A * | 12/2000 | Erbsloh | C23C 14/0036 427/248.1 |
| 6,231,956 B1 * | 5/2001 | Brenner | C23C 28/347 428/216 |
| 9,086,148 B2 * | 7/2015 | Kennedy | C23C 14/025 |
| 10,697,543 B2 * | 6/2020 | Bauer | C23C 14/0641 |
| 2005/0163677 A1 * | 7/2005 | Galligan | B01D 53/885 422/180 |
| 2005/0214540 A1 * | 9/2005 | Maslar | F16J 10/04 428/408 |
| 2006/0076231 A1 | 4/2006 | Wei | |
| 2007/0224349 A1 * | 9/2007 | Hosenfeldt | C23C 14/024 427/249.1 |
| 2012/0228124 A1 | 9/2012 | Veprek et al. | |
| 2012/0251023 A1 | 10/2012 | Gaertner et al. | |
| 2012/0318228 A1 * | 12/2012 | Aharonov | C23C 28/044 123/193.2 |
| 2013/0140776 A1 * | 6/2013 | Kennedy | C23C 14/325 277/442 |

FOREIGN PATENT DOCUMENTS

| | | |
|---|---|---|
| JP | H06279998 A | 10/1994 |
| JP | H1081969 A | 3/1998 |
| JP | 2003013225 A | 1/2003 |
| WO | 2012100847 A | 8/2012 |

OTHER PUBLICATIONS

International Search Report, dated Jan. 19, 2015 (PCT/US2014/018818).

Search Results under Rule 164(2)(b) EPC dated Nov. 20, 2017 (EP14709851).

* cited by examiner

CYLINDER LINERS WITH ADHESIVE METALLIC LAYERS AND METHODS OF FORMING THE CYLINDER LINERS

CROSS REFERENCE TO RELATED APPLICATION

This U.S. Divisional application claims priority to U.S. Utility application Ser. No. 13/801,736, filed Mar. 13, 2013, and is incorporated herein by reference.

BACKGROUND OF THE INVENTION

1. Field of the Invention

This invention relates generally to coated cylinder liners and methods of manufacturing the coated cylinder liners.

2. Related Art

Cylinders of internal combustion engines often include a liner or sleeve fitted into the engine block. The cylinder liner includes an outer surface and inner surface surrounding a cylindrical area. The inner surface of the cylinder liner faces toward a piston and provides an interface or sliding surface for the piston rings during a combustion cycle and operation of the internal combustion engine. Thus, the cylinder liner is typically formed of a hard, wear resistant material. A wear resistant coating, such as a diamond-like carbon (DLC) coating, can also be applied on the inner surface to enhance wear resistance.

SUMMARY OF THE INVENTION

One aspect of the invention provides a method of manufacturing a coated cylinder liner. The method includes providing a body including an inner surface extending from a first body end to a second body end. The inner surface surrounds a center axis to present a bore, a first opening at the first body end, and a second opening at the second body end. The method next includes disposing a consumable metallic electrode formed of metal in the bore of the body. The method then includes sealing the first opening and the second opening to form a deposition chamber along the inner surface, and sputtering the metal of the consumable metallic electrode onto the inner surface of the body.

Another method of manufacturing a coated cylinder liner includes providing a body including an inner surface extending from a first body end to a second body end. The inner surface surrounds a center axis to present a bore, a first opening at the first body end, and a second opening at the second body end. The method next includes disposing a consumable metallic electrode formed of metal in the bore of the body, and providing at least one magnet along the consumable metallic electrode. The method then includes magnetron sputtering the metal of the consumable metallic electrode onto the inner surface of the body.

Yet another method of manufacturing a coated cylinder includes providing a body including an inner surface extending from a first body end to a second body end. The inner surface surrounds a center axis to present a bore, a first opening at the first body end, and a second opening at the second body end. The method next includes disposing a consumable metallic electrode formed of metal in the bore of the body. The consumable metallic electrode is formed of metal and includes an electrode wall presenting a hollow opening along the center axis and a plurality of orifices extending through the electrode wall. The method next includes providing a carrier gas through the hollow opening and orifices, and sputtering the metal of the consumable metallic electrode onto the inner surface of the body.

Yet another aspect of the invention provides a coated cylinder liner including a body with an inner surface extending from a first body end to a second body end. The inner surface has an inner length extending from the first body end to the second body end and surrounds a center axis to present a bore, a first opening at the first body end, and a second opening at the second body end. A wear resistant layer including a hydrocarbon is disposed over the inner surface, and a metallic adhesive layer is disposed between the wear resistant layer and the inner surface. The metallic adhesive layer is formed of metal and has a thickness extending between the inner surface and the center axis. The thickness of metallic adhesive layer varies by not more than 5% along at least 70% of the inner length.

The method of the present invention provides a generally uniform, thick, wear resistant layer and metallic adhesive layer along the inner surface of the cylinder liner in an efficient manner. The metallic adhesive layer provides superior adhesion such that the layers do not flake during use of the cylinder liner in a combustion engine.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2A provides a cross-sectional top view of a consumable metallic electrode of FIG. 2;

FIG. 4A provides a cross-sectional top view of a consumable metallic electrode of FIG. 4;

DETAILED DESCRIPTION

Figure 4:
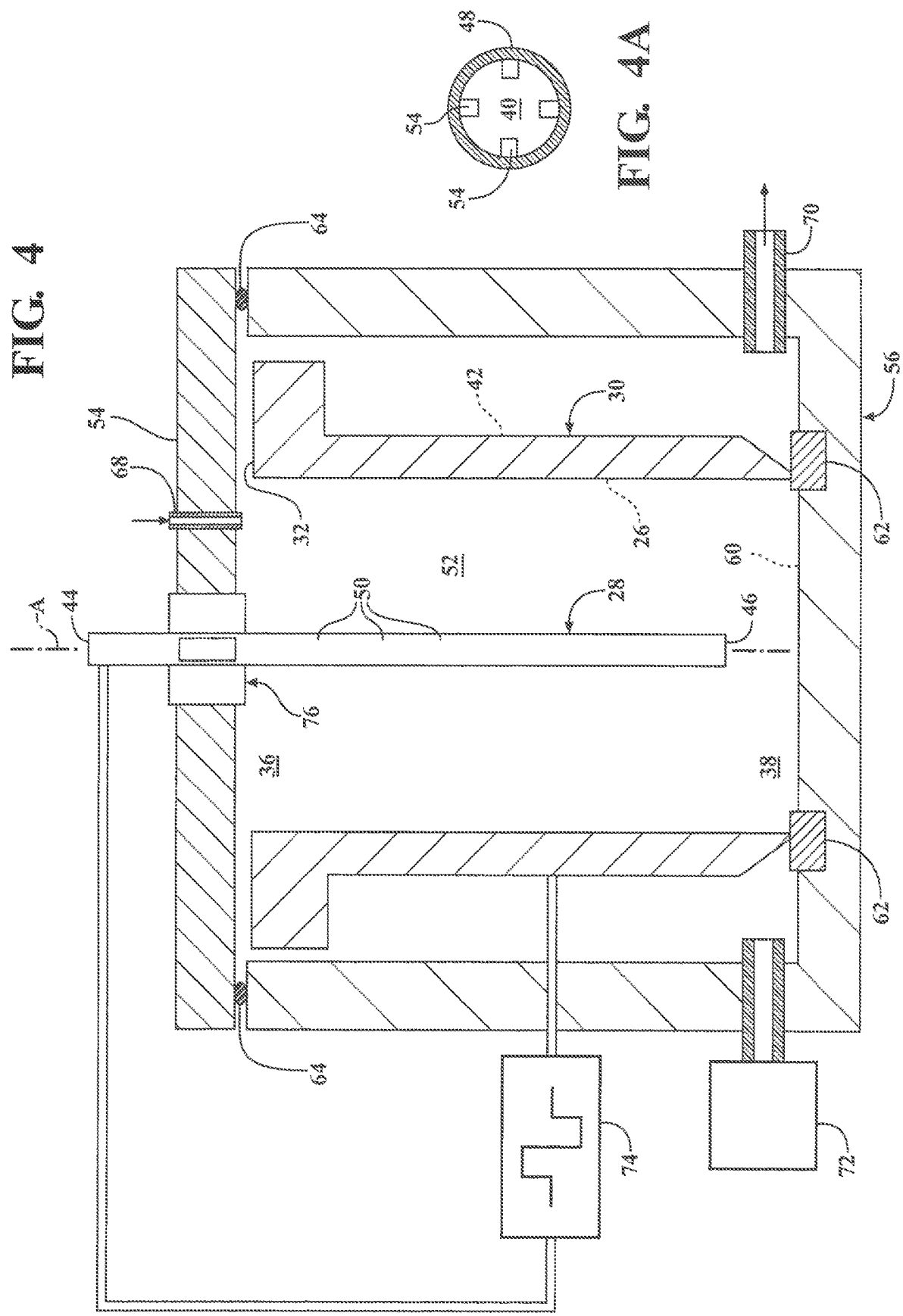
FIG. 4 is a cross-sectional view of a cylinder liner and equipment used to coat the cylinder liner according to yet another embodiment of the invention.
Figure 5:
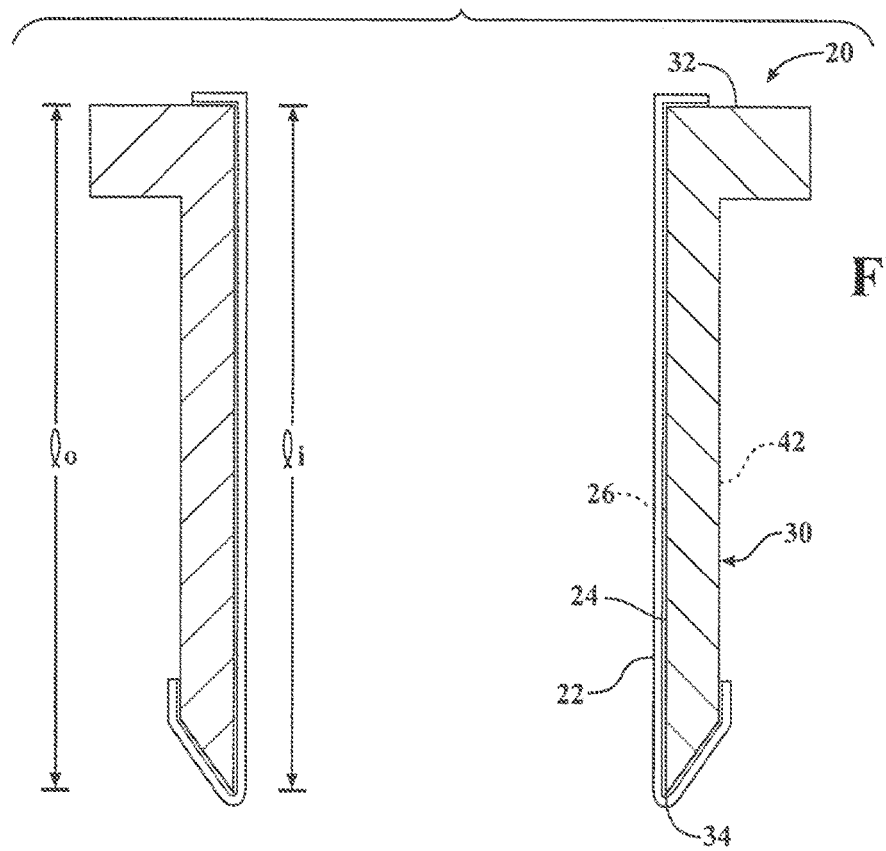
FIG. 5 is a cross-sectional view of a coated cylinder liner according to one embodiment of the invention.

One aspect of the invention provides a method of forming a coated cylinder liner 20 for being disposed in a cylinder block and receiving a piston of an internal combustion engine. Exemplary equipment used to manufacturing the coated cylinder liner 20 are shown in FIGS. 1-4; and an exemplary embodiment of the coated cylinder liner 20 formed according to the method of the present invention is shown in FIG. 5. The method includes sputtering a wear resistant layer 22, such as a diamond-liked carbon (DLC) coating, and metallic adhesive layer 24, such as a chromium or titanium coating, on an inner surface 26 of the cylinder liner 20 to provide superior adhesion and prevent during use of the cylinder liner 20 in the combustion engine. The metallic adhesive layer 24 is provided by sputtering a consumable metallic electrode 28 onto the inner surface 26 of the cylinder liner 20. The thickness $t_a$ of the metallic adhesive layer 24 is substantially uniform and varies by not more than 5% along an inner length $l_i$ of the inner surface 26.

The method of forming the cylinder liner 20 first includes providing a body 30 extending circumferentially along a center axis A and longitudinally between from a first body end 32 to a second body end 34. The body 30 includes the inner surface 26 facing the center axis A and extending longitudinally from the first body end 32 to the second body end 34. The inner surface 26 presents a bore having a cylindrical shape between the first body end 32 and the second body end 34. The bore has volume capable of receiving a piston such that the piston can reciprocate within the cylinder liner 20 and slide along the inner surface 26 during operation of the internal combustion engine. The inner surface 26 presents the inner length $l_i$ extending from the first body end 32 to the second body end 34. The first body end 32 presents a first opening 36 surrounding the center axis A, the second body end 34 presents a second opening 38 surrounding the center axis A, and both openings 36, 38 have a circular shape. The body 30 also presents an outer surface 42 facing opposite the inner surface 26 and extending longitudinally from the first body end 32 to the second body end 34. The outer surface 42 has an outer length $l_o$ extending from the first body end 32 to the second body end 34. The metal material of the body 30 has a hardness of at least 20 HRC and a thermal conductivity of 40 to 50 W/(m·K) such that it is capable of withstanding extreme conductions during a typical combustion cycle. The body 30 typically consists of steel or a steel alloy.

Figure 1:
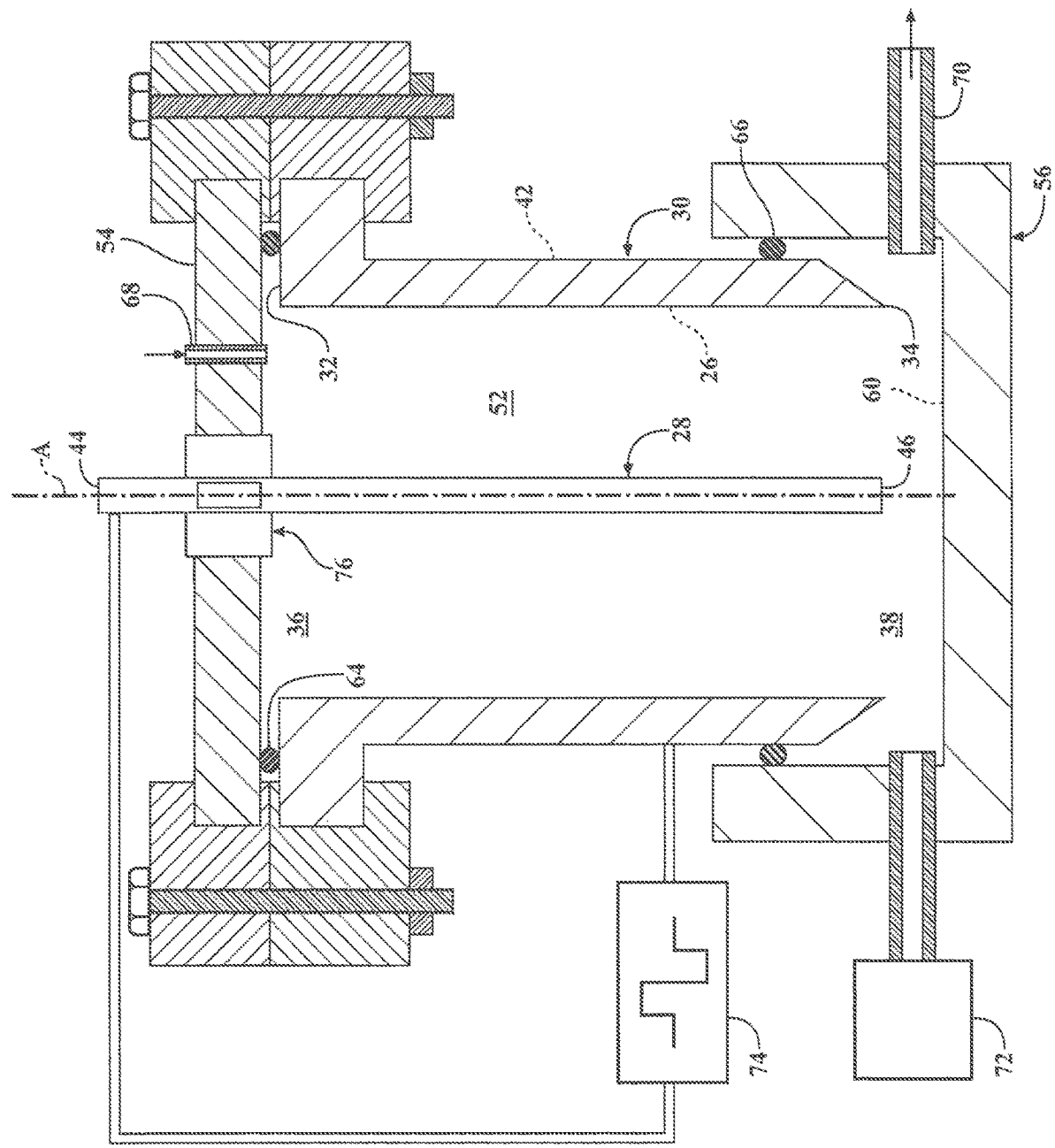
FIG. 1 is a cross-sectional view of a cylinder liner and equipment used to coat the cylinder liner according to one embodiment of the invention.
Figure 2:
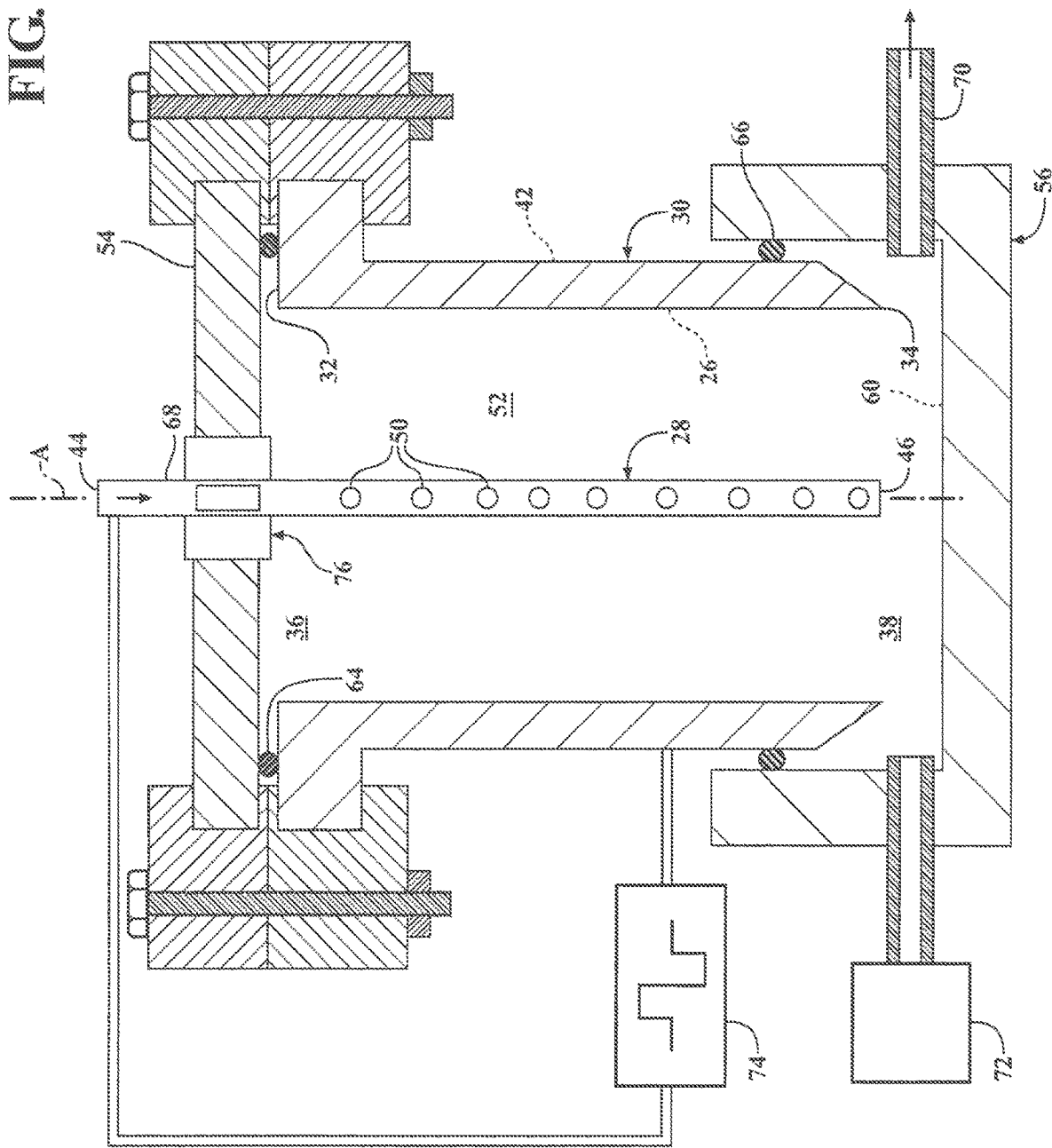
FIG. 2 is a cross-sectional view of a cylinder liner and equipment used to coat the cylinder liner according to another embodiment of the invention.
Figure 3:
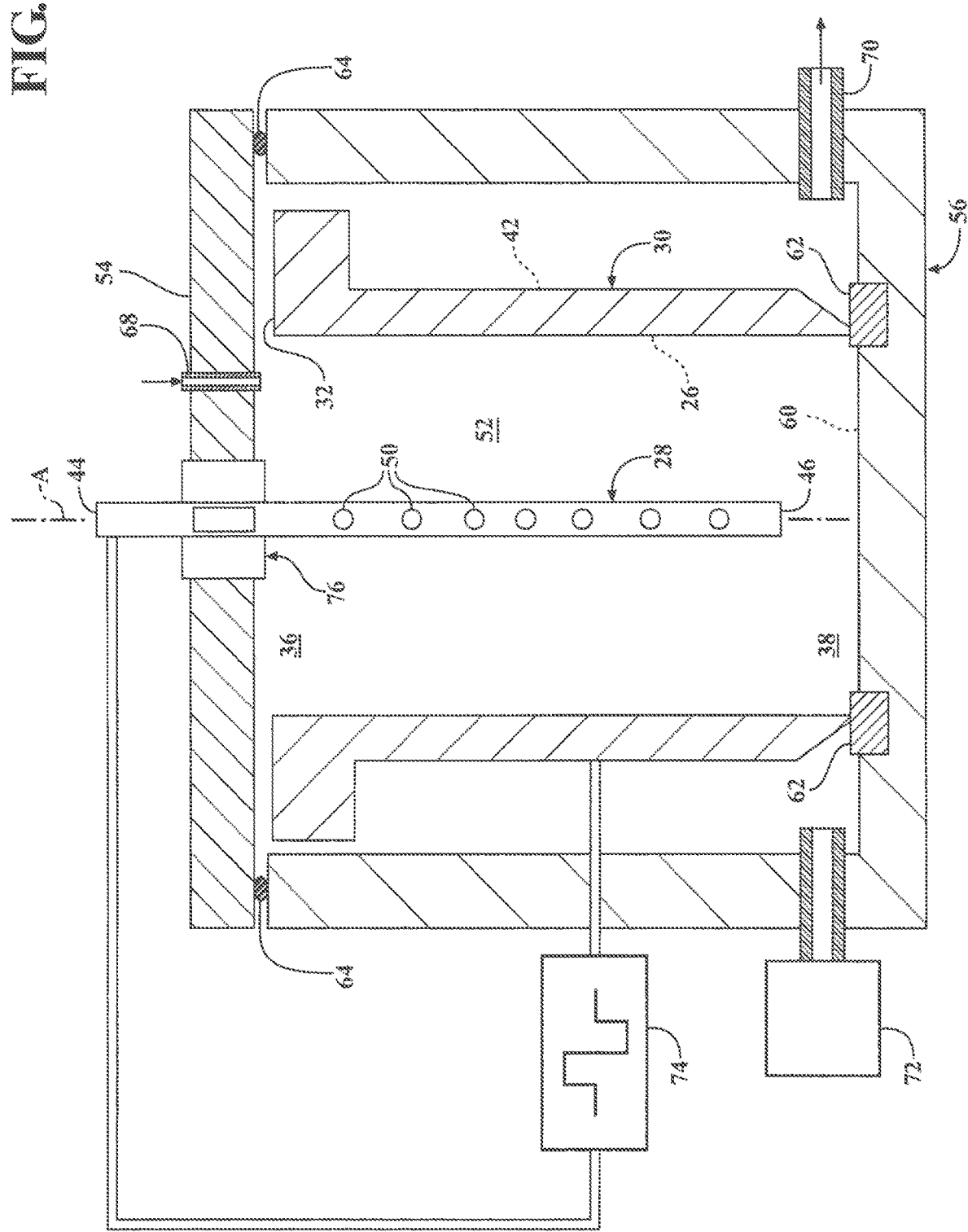
FIG. 3 is a cross-sectional view of a cylinder liner and equipment used to coat the cylinder liner according to yet another embodiment of the invention.

The method next includes disposing the consumable metallic electrode 28 in the bore of the body 30 along the center axis A, as shown in FIGS. 1-3. The consumable metallic electrode 28 extends longitudinally along the center axis A from a first electrode end 44 to a second electrode end 46. The consumable metallic electrode 28 has a diameter less than the diameter of the inner surface 26 to present a space therebetween.

The consumable metallic electrode 28 is formed of metal, and typically consists essentially of metal, or includes metal in an amount of at least 90 wt. %, based on the total weight of the consumable metallic electrode 28. According to one embodiment, consumable metallic electrode 28 includes at least one of chromium and titanium, and preferably consists essentially of chromium and/or titanium.

In one embodiment, shown in FIG. 1, the consumable metallic electrode 28 is solid from the first electrode end 44 to the second electrode end 46. In another embodiment, shown in FIGS. 2-4, the consumable metallic electrode 28 includes an electrode wall 48 surrounding the center axis A and presenting a hollow opening 40 from the first electrode end 44 to the second electrode end 46. In the embodiments of FIGS. 2 and 3, the electrode wall 48 includes a plurality of orifices 50 extending from the hollow opening 40 to the deposition chamber 52. In the embodiment of FIG. 4, the consumable metallic electrode 28 includes the electrode wall 48 presenting the hollow opening 40, and a magnet 54 is disposed in the hollow opening 40 along the electrode wall 48 such that the metallic adhesive layer 24 and the wear resistant layer 22 can be applied by magnetron sputtering.

FIG. 4A provides a cross-sectional view of the consumable metallic electrode 28 of FIG. 4. In this embodiment, the consumable metallic electrode 28 may be formed with or without orifices 50.

The method next includes providing the sealed deposition chamber 52 sufficient for sputtering the wear resistant layer 22 and metallic adhesive layer 24 onto the inner surface 26 of the cylinder liner 20. In the embodiments of FIGS. 1 and 2, the cylinder liner 20 provides a portion of the deposition chamber 52 along the inner surface 26 of the body 30. This is done by coving and sealing the first opening 36 and the second opening 38 of the body 30. The sealing steps preferably include disposing a first cover 56 along the first body end 32 and disposing a second cover 58 along the second body end 34. The first cover 56 is typically a sheet, and the second cover 58 is typically an open half-cylinder presenting an inner cover surface 60. The covers 56, 58 are typically formed of steel.

When the cylinder liner 20 provides the deposition chamber 52, the method also typically includes disposing a first seal 64 on the first body end 32, disposing the first cover 56 on the first seal 64, disposing a second seal 66 around the outer surface 42 of the body 30 adjacent the second body end 34, disposing the second body end 34 in the open half-cylinder, and engaging the second seal 66 with the inner cover surface 60 of the second cover 58 to seal the deposition chamber 52. The step of disposing the second body end 34 in the open half cylinder typically includes spacing the second body end 34 from the second cover 58 such that the second body end 34 and a portion of the outer surface 42 of the body 30 provide the deposition chamber 52. The first and second seals 64, 66 can include any type of gasket, such as an O-ring formed of rubber. The method next includes securing the first cover 56 and the body 30 in place relative to one another, for example using a clamp and bolts.

In the embodiments of FIGS. 3 and 4, the body 30 and the consumable metallic electrode 28 are disposed in a separate sealed deposition chamber 52 provided by the first cover 56 and the second cover 58. In this case, an insulating support 62 is disposed on the inner cover surface 60, and the second body end 34 is mounted on the insulating support 62. The insulating support 62 can be a ring or a plurality of pucks, typically formed of a ceramic material. The first seal 64 is then disposed on an upper end of the second cover 58, and the first cover 56 is disposed on the first seal 64 to provide the sealed deposition chamber 52. In this embodiment, the first cover 56 and second cover 58 can provided a double-wall water-cooled deposition chamber 52.

The method next includes providing a gas inlet 68 to provide a carrier gas into the deposition chamber 52, and providing a vacuum pump 70 to reduce the pressure in the deposition chamber 52 prior to sputtering. This step can include extending the gas inlet 68 through the first cover 56 and into the deposition chamber 52, and extending the vacuum pump 70 through the second cover 58 into the deposition chamber 52. A vacuum gage 72 may also be provided for measuring the pressure in the deposition chamber 52, and it typically extends through the second cover 58 into the deposition chamber 52. In the embodiments of FIGS. 2 and 3, when the consumable metallic electrode 28 provides the hollow opening 40 and orifices 50, the gas inlet 68 extends through the first cover 56 and into the hollow opening 40. FIG. 2A provides a cross-sectional view of the consumable metallic electrode 28 with the hollow opening 40 and orifices 50. In this embodiment, the carrier gas flows through the orifices 50 and is distributed more evenly throughout deposition chamber 52, compared to the embodiment of FIGS. 1 and 4.

The method also includes providing a power supply 74 for applying a negative voltage to the first electrode end 44 of the consumable metallic electrode 28, as shown in FIGS. 1-4, which is necessary to sputter the consumable metallic electrode 28 onto the inner surface 26 of the body 30. The power supply 74 and the first electrode end 44 can be interconnected by an electrically isolating feed-through 76 extending through the first cover 56.

Once the sealed deposition chamber 52 and equipment are provided, the method includes providing the conditions necessary to sputter the metal of the consumable metallic electrode 28 onto the inner surface 26. This includes decreasing the pressure of the deposition chamber 52 to form a vacuum, and applying a negative voltage to the first electrode end 44 to provide plasma in the deposition chamber 52, typically a glow plasma or hollow cathode discharge plasma. The voltage is provided by the power supply 74 and is typically a pulsed radio frequency (RF) voltage or a pulsed direct current (DC) voltage. The method also includes supplying a carrier gas including positively charged ions into the sealed deposition chamber 52. The carrier gas can be supplied to the deposition chamber 52 for a period of time to clean the inner surface 26 of the body 30, prior to sputtering the metal onto the inner surface 26. The positively charged ions typically include at least one of argon (Ar) and hydrogen ($H_2$). In the embodiment of FIGS. 2 and 3, when the consumable metallic electrode 28 includes the hollow opening 40 and orifices 50, the step of providing the carrier gas includes providing the carrier gas into the hollow opening 40 and through the orifices 50 of the consumable metallic electrode 28 and into the deposition chamber 52.

The combination of the low pressure vacuum, negative voltage, and positive ions of the carrier gas causes sputtering of the metal of the consumable metallic electrode 28 onto the inner surface 26 of the body 30. The sputtering step provides the metallic adhesive layer 24 formed of the metal of the consumable metallic electrode 28 on the inner surface 26 of the body 30. The method can include increasing the pressure of the deposition chamber 52 to adjust the amount of metal sputtered onto the inner surface 26 of the body 30, or adjusting the amount of carrier gas supplied to the deposition chamber 52 to adjust the amount of metal sputtered onto the inner surface 26 of the body 30.

As stated above, the thickness $t_a$ of the metallic adhesive layer 24 formed on the inner surface 26 of the body 30 is substantially uniform. The thickness t extends perpendicular to the center axis A and varies by not more than 5% along at least 70% of the inner length $l_l$, preferably not more than 3% along at least 70% of the inner length $l_l$, or not more than 1% along at least 70% of the inner length $l_l$. The thickness $t_a$ may decrease slightly adjacent the first body end 32 and the second body end 34.

In the embodiments of FIGS. 1 and 2, since the second body end 34 is spaced from the second cover 58, the metallic adhesive layer 24 is disposed on the second body end 34 and on at least a portion of the outer surface 42, between the second body end 34 and the second seal 66. In this embodiment, the metallic adhesive layer 24 extends along the outer surface 42 from the second body end 34 toward the first body end 32 and along 1 to 40% of the outer length $l_o$. Also in the embodiments of FIGS. 1 and 2, when the cylinder liner 20 provides the deposition chamber 52, the metallic adhesive layer 24 is disposed on at least a portion of the first electrode end 44 between the inner surface 26 and the first seal 64. FIG. 5 illustrates the location of the metallic adhesive layer 24 of this embodiment.

After applying the metallic adhesive layer 24 on the inner surface 26 of the body 30, the method includes providing at least one wear resistant component through the gas inlet 68 and into the deposition chamber 52, and depositing the wear resistant component on the metallic adhesive layer 24 to form the wear resistant layer 22. The at least one wear resistant component includes a hydrocarbon, such as acetylene or methane. The wear resistant component can also include silicon, derived from trimethylsilane, or germanium from germanium containing gas precursor. In one preferred embodiment, the wear resistant layer 22 formed from the resistant component is diamond-like carbon (DLC) coating. When the cylinder liner 20 provides the deposition chamber 52, the wear resistant layer 22 also extends along the second body end 34 and along a portion of the outer surface 42.

The thickness $t_w$ of the wear resistant layer 22 formed on the inner surface 26 of the body 30 is also substantially uniform. The thickness $t_w$ extends perpendicular to the center axis A and varies by not more than 5% along at least 70% of the inner length $l_l$, preferably not more than 3% along at least 70% of the inner length $l_l$, or not more than 1% along at least 70% of the inner length $l_l$.

The method can also include firming at least one intermediate metallic layer 78 between the metallic adhesive layer 24 and the wear resistant layer 22, The intermediate metallic layer 78 is typically formed of a mixture of the metal of the consumable metallic electrode 28 and at least one secondary component, such as nitrogen. In this embodiment, the method includes providing the at least one secondary component in the carrier gas after sputtering at least some of the metal of the consumable metallic electrode 28 and before depositing the wear resistant component onto the inner surface 26. A mixture of the secondary component and the metal of the consumable metallic electrode 28 is sputtered onto the adhesive metallic layer to provide the intermediate metallic layer 78 on the adhesive metallic layer. In one embodiment, the intermediate metallic layer 78 consists of CrN or TiN.

The method can also include providing a plurality of the wear resistant layers 22 and a plurality of the intermediate metallic layers 78, wherein adjacent wear resistant layers 22 can be spaced from one another by the intermediate metallic layers 78. The wear resistant layers 22 and intermediate metallic layers 78 can each have the same composition, or different compositions. In another embodiment, the method includes providing a plurality of the metallic adhesive layers 24 and a plurality of the wear resistant layers 22, wherein adjacent wear resistant layers 22 can be spaced from one another by the metallic adhesive layers 24.

Another aspect of the invention provides the cylinder liner 20 formed by the method of the present invention. An exemplary embodiment of the cylinder liner 20 is shown in FIG. 5. The cylinder liner 20 includes the body 30 formed of the metal material extending circumferentially along the center axis A and longitudinally from the first body end 32 to the second body end 34. The body 30 includes the inner surface 26 facing the center axis A and extending longitudinally from the first body end 32 to the second body end 34. The inner surface 26 surrounds the center axis A and presents the bore having a cylindrical shape between the first body end 32 and the second body end 34. The inner surface 26 also has the inner length $l_l$ extending from the first body end 32 to the second body end 34. The first body end 32 presents a first opening 36 surrounding the center axis A and having a circular shape, and the second body end 34 presents a second opening 38 surrounding the center axis A and having a circular shape. The bore has a volume capable of receiving a piston such that the piston can reciprocate within the cylinder liner 20 and slide along the inner surface 26 during operation of the internal combustion engine.

The body 30 also presents the outer surface 42 facing opposite the inner surface 26 and extending longitudinally from the first body end 32 to the second body end 34. The outer surface 42 has an outer length $l_o$ extending from the first body end 32 to the second body end 34. The metal material of the body 30 has a hardness of at least 20 HRC and a thermal conductivity of 40 to 50 W/(m·K) and is capable of withstanding extreme conductions during a typical combustion cycle. The metal material of the body 30 is typically steel or a steel alloy.

The wear resistant layer 22 is disposed on the inner surface 26 and is applied by sputtering, as discussed above. In one embodiment, the wear resistant layer 22 is a diamond-like carbon (DLC) coating. The DLC coating is typically derived from a hydrocarbon gases, such as acetylene, or methane, and at least one of silicon, such as trimethylsilane, or germanium. The wear resistant layer 22 typically extends continuously from the first body end 32 to the second body end 34. The thickness $t_w$ of the wear resistant layer 22 formed on the inner surface 26 of the body 30 is substantially uniform. The thickness $t_w$ of the wear resistant layer 22 extends perpendicular to the center axis A and varies by not more than 5% along at least 70% of the inner length $l_i$, preferably not more than 3% along at least 70% of the inner length $l_i$, or not more than 1% along at least 70% of the inner length $l_i$.

Figure 5A:
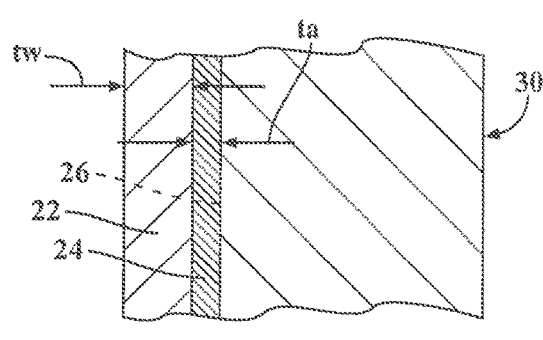
FIG. 5A is an enlarged view of a portion of the coated cylinder liner of FIG. 5.

The metallic adhesive layer 24 is disposed between the wear resistant layer 22 and the inner surface 26. The metallic adhesive layer 24 adheres the wear resistant layer 22 to the inner surface 26. In one embodiment, as shown in FIG. 5A, the metallic adhesive layer 24 is sandwiched between the wear resistant layer 22 and the inner surface 26, such that the metallic adhesive layer 24 is disposed directly on the inner surface 26 and the wear resistant layer 22 is disposed directly on the metallic adhesive layer 24. The metallic adhesive layer 24 comprises metal in an amount of at least 90 wt. %, based on the total weight of the metallic adhesive layer 24, and preferably consists essentially of metal. In one embodiment, the metal of the metallic adhesive layer 24 includes at least one of chromium and titanium, and preferably consists of chromium or titanium.

The method used to apply the metallic adhesive layer 24 provides a generally uniform thickness $t_a$ between the inner surface 26 and the center axis A and extending perpendicular to the center axis A. The thickness $t_a$ of the metallic adhesive layer 24 varies by not more than 5% along at least 70% of the inner length $l_i$, preferably by not more than 3% along at least 70% of the inner length $l_i$, or not more than 1% along at least 70% of the inner length $l_i$ ($l_i$).

When the body 30 of the cylinder liner 20 provides the deposition chamber 52, as shown in FIGS. 1 and 2, the metallic adhesive layer 24 is disposed on at least a portion of the outer surface 42 adjacent the second body end 34. In this case the metallic adhesive layer 24 extends along the outer surface 42 from the second body end 34 toward the first body end 32 and along 1 to 40% of the outer length $l_o$.

The cylinder liner 20 can also include an intermediate metallic layer 78 between the metallic adhesive layer 24 and the wear resistant layer 22. The intermediate metallic layer 78 comprises a mixture of the material of the metallic adhesive layer 24 and a second component, such as nitrogen. For example, the intermediate metallic layer 78 can be formed of CrN or TiN.

Figure 5B:
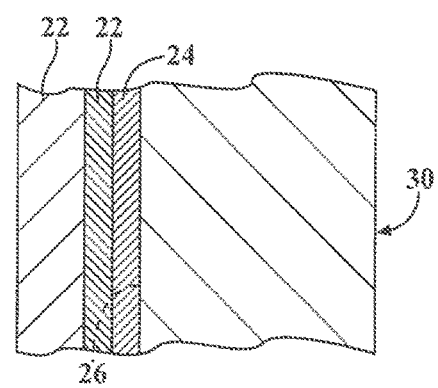
FIG. 5B illustrates a portion of a coated cylinder liner according to another embodiment of the invention.
Figure 5C:
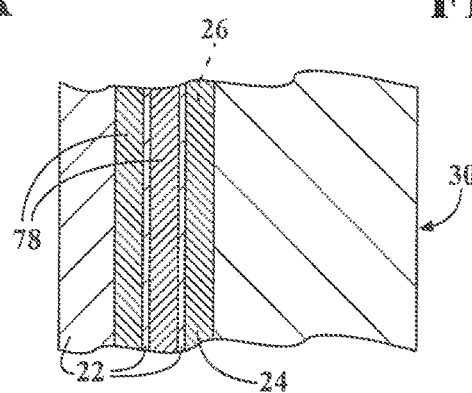
FIG. 5C illustrates a portion of a coated cylinder liner according to yet another embodiment of the invention.

In certain embodiments, shown in FIGS. 5B and 5C, the cylinder liner 20 includes a plurality of the wear resistant layers 22 and a plurality of the intermediate metallic layers 78, wherein adjacent wear resistant layers 22 are spaced from one another by the intermediate metallic layers 78. The wear resistant layers 22 and intermediate metallic layers 78 can each have the same composition, or different compositions. In another embodiment, the cylinder liner 20 includes a plurality of the metallic adhesive layers 24 and a plurality of the wear resistant layers 22, wherein adjacent wear resistant layers 22 are spaced from one another by the metallic adhesive layers 24. In the embodiment of FIG. 5B, the cylinder liner 20 includes two wear resistant layers 22 and one metallic adhesive layer 24 bonding the wear resistant layers 22 to the inner surface 26 of the body 30. The outer wear resistant layer 22 is a DLC coating including methane, the inner wear resistant layer 22 is a DLC coating including silicon, and the metallic adhesive layer 24 is firmed of chromium. In the embodiment of FIG. 5C, the cylinder liner 20 includes three wear resistant layers 22, two intermediate metallic layers 78, each spacing adjacent wear resistant layers 22, and one metallic adhesive layer 24 bonding the innermost wear resistant layers 22 to the inner surface 26 of the body 30. The wear resistant layers 22 are each a DLC coating, the intermediate metallic layers 78 are each formed of CrN, and the metallic adhesive layer 24 is formed of chromium.

Obviously, many modifications and variations of the present invention are possible in light of the above teachings and may be practiced otherwise than as specifically described while within the scope of the appended claims.

What is claimed is:

1. A cylinder liner, comprising:
 a body extending from a first body end to a second body end;
 said body including an inner surface extending from said first body end to said second body and having an inner length extending from said first body end to said second body end;
 said inner surface surrounding a center axis to present a bore and a first opening at said first body end and a second opening at said second body end;
 a first layer disposed over said inner surface;
 a metallic adhesive layer disposed between said first layer and said inner surface, said metallic adhesive layer being formed of metal;
 said metallic adhesive layer having a thickness extending between said inner surface and said center axis; and
 said thickness of metallic adhesive layer varying by not more than 5% along at least 70% of said inner length.

2. The cylinder liner of claim 1, wherein said thickness of metallic adhesive layer varies by not more than 3% along at least 70% of said inner length.

3. The cylinder liner of claim 1, wherein said metallic adhesive layer is disposed on said inner surface by sputtering a consumable metallic electrode formed of said metal onto said inner surface, said body includes an outer surface facing opposite said inner surface; and said metallic adhesive layer extends along said second body end and a portion of said outer surface.

4. The cylinder liner of claim 3 wherein said metallic adhesive layer extends along a portion of said first body end.

5. The cylinder liner of claim 1 wherein said metal of said metallic adhesive layer is selected from the group consisting of chromium and titanium, and wherein said first layer is a diamond-like carbon (DLC) coating.

6. A cylinder liner for receiving a piston of an internal combustion engine, comprising:
a body formed of a metal material extending circumferentially along a center axis and longitudinally between from a first body end to a second body end;
said body including an inner surface facing said center axis and extending longitudinally from said first body end to said second body end;
said inner surface surrounding said center axis and presenting a bore between said first body end and said second body end;
said inner surface having an inner length extending from said first body end to said second body end;
said first body end presenting a first opening surrounding said center axis;
said second body end presenting a second opening surrounding said center axis and having a circular shape;
said bore having volume capable of receiving a piston such that said piston can reciprocate within said cylinder liner and slide along said inner surface during operation of the internal combustion engine;
said body presenting an outer surface facing opposite said inner surface and extending longitudinally from said first body end to said second body end;
said outer surface having an outer length extending from said first body end to said second body end;
said metal material of said body having a hardness of at least 20 HRC and a thermal conductivity of 40 to 50 W/(m·K);
said metal material of said body consisting of steel or a steel alloy;
a first layer disposed on said inner surface, said first layer produced by a sputtering process;
said first layer being a diamond-like carbon (DLC) material;
said first layer extending continuously from said first body end to said second body end;
said first layer having a thickness extending between said inner surface and said center axis;
said thickness of said first layer varying by not more than 5% along at least 70% of said inner length; and
a metallic adhesive layer disposed between said first layer and said inner surface;
said metallic adhesive layer adhering said first layer to said inner surface;
said metallic adhesive layer including at least one of chromium and titanium;
said metallic adhesive layer having a thickness extending between said inner surface and said center axis;
said thickness of said metallic adhesive layer varying by not more than 5% along at least 70% of said inner length; and
said metallic adhesive layer being disposed on said second body end and along 1 to 40% of said outer length adjacent said second body end.

* * * * *